(12) United States Patent
Chiang

(10) Patent No.: US 7,527,536 B2
(45) Date of Patent: May 5, 2009

(54) CONTACT TERMINAL WITH SUPPORTED BODY

(75) Inventor: Chen-Shiang Chiang, Tamshui (TW)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 12/005,972

(22) Filed: Dec. 28, 2007

(65) Prior Publication Data
US 2008/0160844 A1    Jul. 3, 2008

(30) Foreign Application Priority Data
Dec. 28, 2006 (TW) .............................. 95223020 U

(51) Int. Cl.
*H01R 13/02* (2006.01)
(52) U.S. Cl. ..................................... 439/884
(58) Field of Classification Search ................ 439/884, 439/83, 82, 78, 862, 331, 73
See application file for complete search history.

(56) References Cited

U.S. PATENT DOCUMENTS 5,860,838 A * 1/1999 Kaneko ...................... 439/857
6,905,377 B2 * 6/2005 Murr .......................... 439/862
6,955,572 B1 * 10/2005 Howell ....................... 439/862
6,976,888 B2 * 12/2005 Shirai et al. ................. 439/862
7,052,289 B1 * 5/2006 Hao ............................ 439/83
7,297,010 B2 * 11/2007 Tsai ............................ 439/331

* cited by examiner

*Primary Examiner*—Chandrika Prasad

(57) ABSTRACT

An electrical connector includes an insulating housing and a plurality of terminals. The insulating housing includes a plurality of terminal grooves, the terminals being disposed respectively in the terminal grooves, each terminal including a first body and a second body having lateral edges adjacent to each other, the first body extending downward to form a soldering portion, the second body bending and extending upward to form a resilient contact arm, characterized in that: the terminal further includes a first support arm and a second support arm bending and extending from the lateral edge of the first body to the adjacent lateral edge of the second body, and a first tab extending from the lateral edge of the first body between the first and second support arms, the first tab of each terminal being retained on a wall surface forming the corresponding terminal groove.

12 Claims, 7 Drawing Sheets

CONTACT TERMINAL WITH SUPPORTED BODY

FIELD OF THE INVENTION

This invention relates to an electrical connector, more particularly to an electrical connector with a reduced height and which has a terminal that can be mounted firmly, and the terminal thereof.

BACKGROUND OF THE INVENTION

Referring to FIG. 1 and FIG. 2, R.O.C. Utility Model Patent No. 282355 discloses an electrical connector 100, which is adapted to be electrically connected to a central processing unit (Central Process Unit, CPU) 19 and a circuit board 18. A terminal 11 of the electrical connector 100 includes a body 111, a soldering portion 112 electrically connected to the circuit board 18 through a solder ball 17, and a resilient arm 113 bending and extending from a lateral edge of the body 111 and further extending slantingly upward. A distal end of the resilient arm 113 is formed with a contact portion 114 to be press-contacted by the central processing unit 19 downwardly from above. Moreover, the lateral edged of the body 111 stick out to form a plurality of tabs 115 below the resilient arm 113. By means of the tabs 115 that are retained in a wall surface of a terminal groove 121 in an insulating housing 12, the terminal 11 can be secured in the terminal groove 121.

However, since the terminal 11 is provided with the tabs 115 only at the lower half section of the body 111, the upper half section (e.g., the resilient arm 113) of the terminal 11 is still very long. When the central processing unit 19 press-contacts the contact portion 114 of the terminal 11, the arm of force may be considered to be very long, so that the torque experienced by the terminal 11 is very large. As a result, the terminal 11 may easily wobble in the terminal groove 121 to affect the stability of the electrical connection.

Referring to FIG. 3, R.O.C. Utility Model Patent No. 258477 discloses another terminal 13. The terminal 13 is formed with tabs 135 at a lateral edge of the body 131 both above and below where the resilient arm 133 joins the body 131. Therefore, the terminal 123 can be firmly disposed in the terminal groove to thereby solve the aforesaid drawback. However, since the tabs 135 are retained at the wall surface forming the terminal groove, the height of the terminal groove must be greater than the distance between the two farthest apart tabs 135. Thus, the height of the insulating housing cannot be reduced considerably, i.e., the electrical connector cannot be designed to have a low profile, thereby rendering thinning of the computer device to reduce space impossible. Therefore, the object of this invention is to provide an electrical connector with a reduced height and having a terminal that can be mounted firmly, and the terminal thereof.

SUMMARY OF THE INVENTION

Accordingly, the terminal of this invention includes a first body and a second body having lateral edges adjacent to each other, the first body extending downward to form a soldering portion, the second body bending and extending upward to form a resilient contact arm, a distal end of the resilient contact arm being formed with a contact portion. The terminal further includes a first support arm and a second support arm bending and extending from the lateral edge of the first body to the adjacent lateral edge of the second body, and a first tab extending from the lateral edge of the first body between the first and second support arms.

Accordingly, the electrical connector of this invention includes an insulating housing and a plurality of terminals.

The insulating housing includes a plurality of terminal grooves. The terminals are respectively disposed in the terminal grooves, each terminal including a first body and a second body having lateral edges adjacent to each other, the first body extending downward to form a soldering portion, the second body bending and extending upward to form a resilient contact arm, a distal end of the resilient contact arm being formed with a contact portion, wherein each terminal further includes a first support arm and a second support arm bending and extending from the lateral edge of the first body to the adjacent lateral edge of the second body, and a first tab extending from the lateral edge of the first body between the first and second support arms, the first tab of each terminal being retained on a wall surface forming the corresponding terminal groove.

In an embodiment, the lateral edge of the first body further has a second tab extending therefrom below the first and second support arms.

The effect of this invention resides in that the first tab extending from the lateral edge of the first body is located between the first and second support arms. Therefore, compared with the prior art in which the tab is disposed only below the resilient arm, the distance between the first tab and the contact portion in this invention is smaller than the distance between the tab and the contact portion in the prior art, i.e., when the central processing unit press-contacts the contact portion of the terminal, the arm of force in this invention can be considered to be shorter than the arm of force in the prior art, and the torque experienced by the terminal is smaller. Therefore, the terminal of this invention can be more firmly disposed in the terminal groove. If a second tab is additionally provided below the first and second support arms for enhanced stability, compared with the prior art in which tabs are respectively disposed above and below a juncture between the resilient arm and the body, the distance between the first and second tabs of this invention can be smaller than the distance between the two tabs of the prior art, so that the height of the insulating housing of this invention can be reduced.

BRIEF DESCRIPTION OF THE DRAWINGS

The organization and manner of the structure and operation of the invention, together with further objects and advantages thereof, may best be understood by reference to the following description taken in connection with the accompanying drawings wherein like reference numerals identify like elements in which.

DETAILED DESCRIPTION OF THE DISCLOSED EMBODIMENTS

Figure 1:
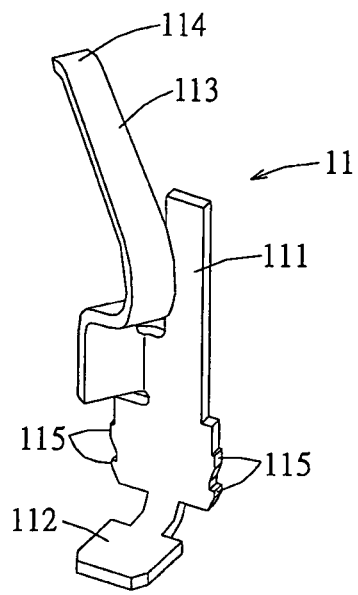
FIG. 1 is a perspective view to illustrate the first type of terminal in the prior art.
Figure 2:
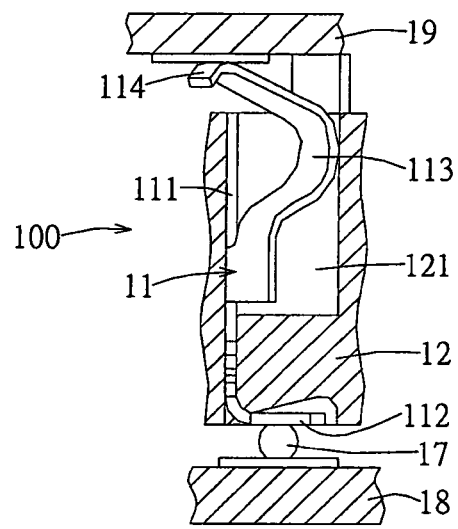
FIG. 2 is a sectional side view illustrating that the first type of terminal of the prior art is mounted in a terminal groove of an insulating housing.
Figure 3:
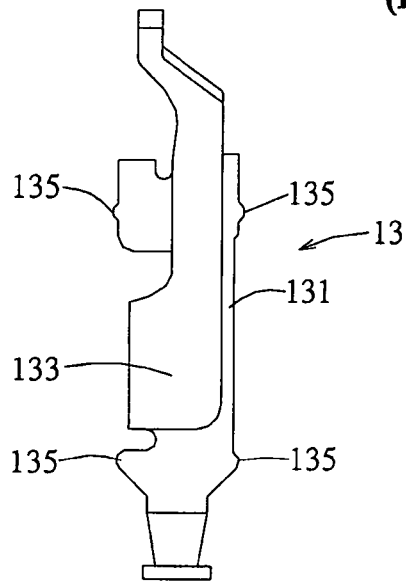
FIG. 3 is a side view to illustrate the second type of terminal of the prior art.

While this invention may be susceptible to embodiment in different forms, there is shown in the drawings and will be described herein in detail, a specific embodiment with the understanding that the present disclosure is to be considered an exemplification of the principles of the invention, and is not intended to limit the invention to that as illustrated. The aforesaid and other technical contents, features and effects of this invention will become apparent in the following detailed description of four preferred embodiments with reference to the drawings.

Figure 4:
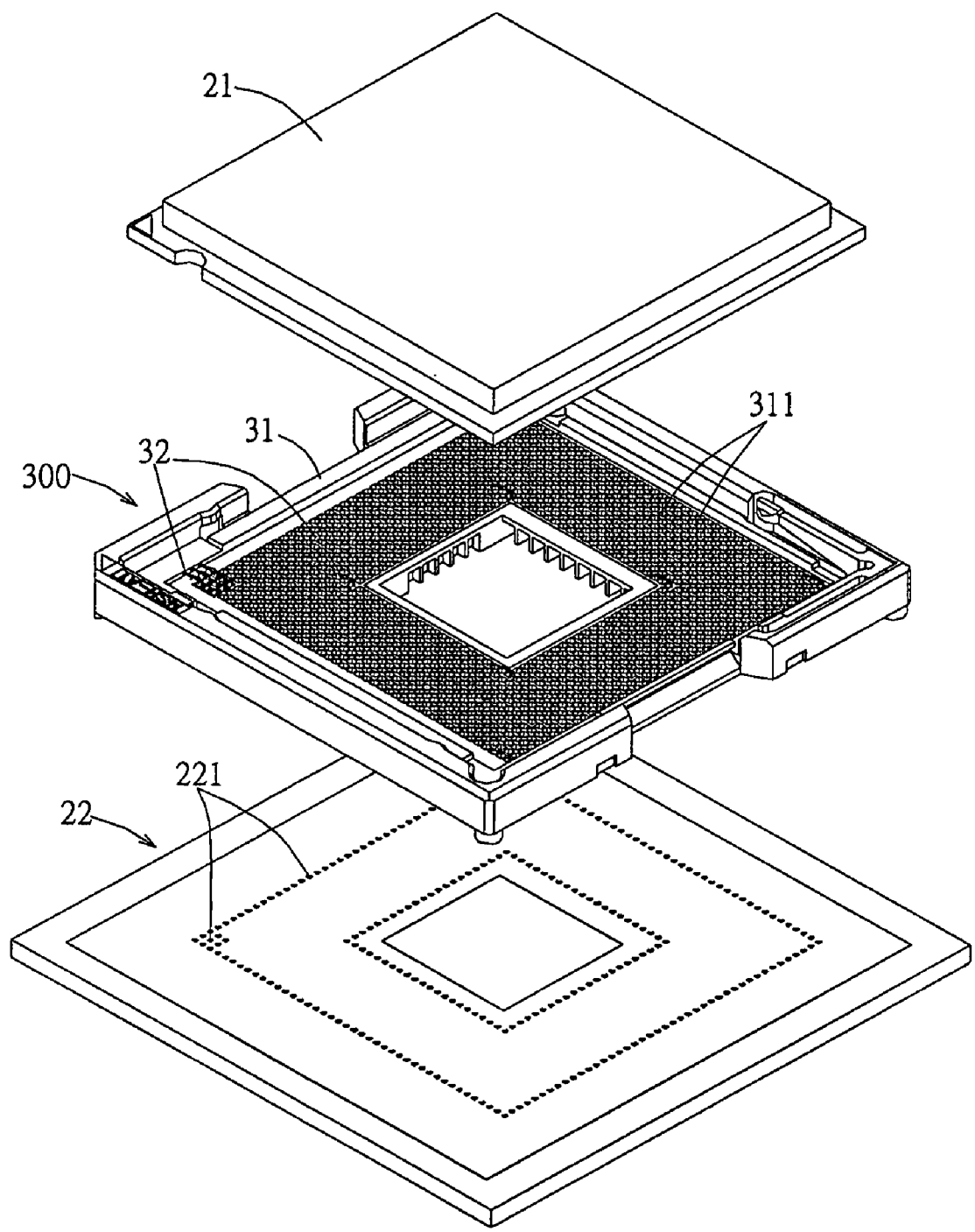
FIG. 4 is an exploded perspective view to illustrate the first preferred embodiment of the electrical connector and the terminal thereof according to this invention, some terminals and circuit board contacts being omitted from the figure.
Figure 5:
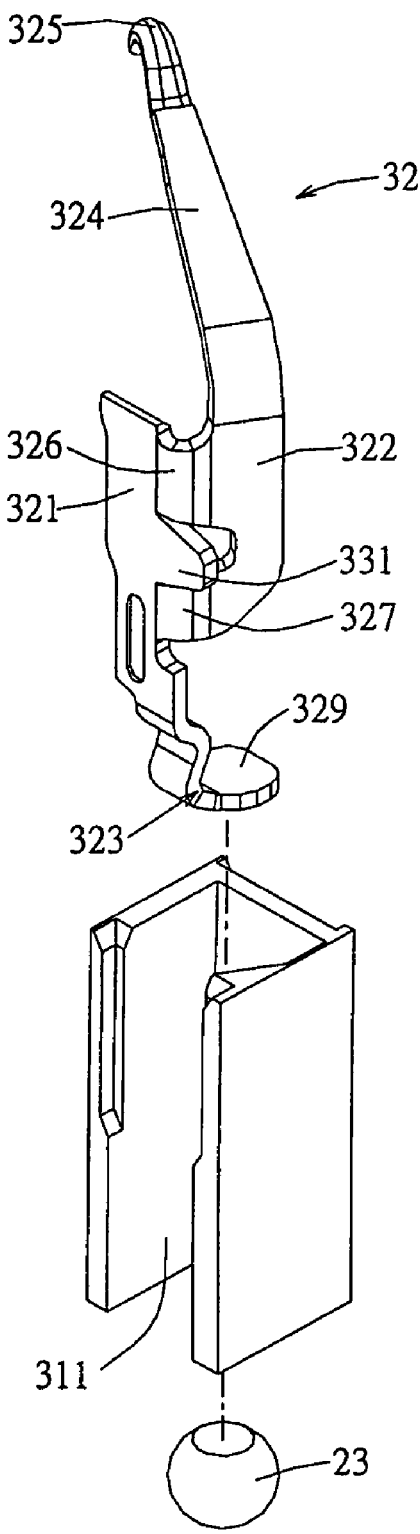
FIG. 5 is an exploded perspective view to illustrate relative positions of the terminal and a terminal groove of an insulating housing of the first preferred embodiment.
Figure 6:
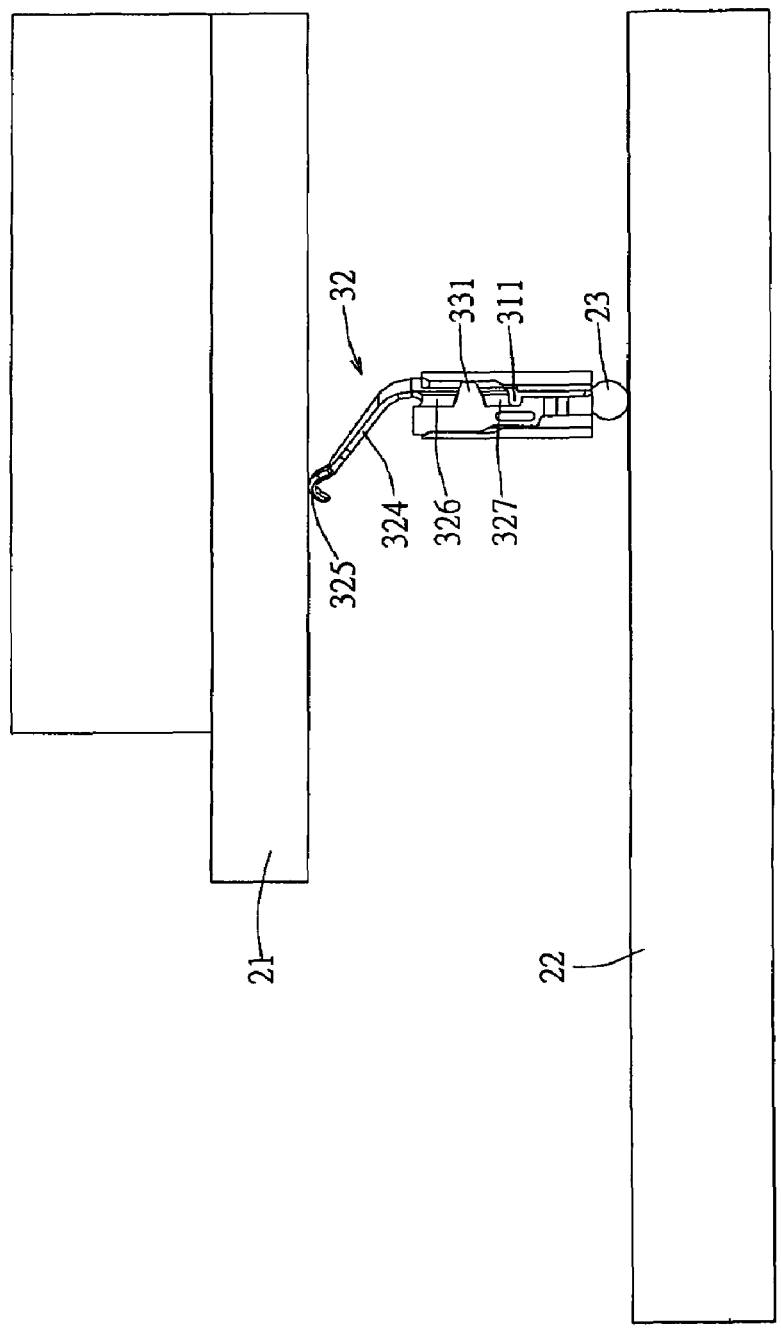
FIG. 6 is a schematic side view illustrating that a first tab of the terminal of the first preferred embodiment is retained on a wall surface forming the corresponding terminal groove, only one terminal and one terminal groove being shown in the figure.

Referring to FIG. 4, FIG. 5 and FIG. 6, the first preferred embodiment of this invention discloses an electrical connector 300 adapted for electrically connecting a central processing unit 21 (Central Process Unit, CPU) and a circuit board 22. The electrical connector 300 includes an insulating housing 31 and a plurality of terminals 32.

The insulating housing 31 is disposed on the circuit board 22, and includes a plurality of terminal grooves 311 that extend through top and bottom faces.

The terminals 32 are formed from an electrically conductive material, and are respectively disposed in the terminal grooves 311, each terminal 32 including a first body 321 and a second body 322 with lateral edges adjacent to each other, the first body 321 extending downward to form a soldering portion 323, the second body 322 bending and extending upward to form a resilient contact arm 324, a distal end of the resilient contact arm 324 being formed with a contact portion 325. Each terminal 32 further includes a first support arm 326 and a second support arm 327 bending and extending from the lateral edge of the first body 321 to the adjacent lateral edge of the second body 322. A first tab 331 extends from the lateral edge of the first body 321 between the first and second support arms 326, 327, and each terminal is retained on a wall surface forming the corresponding terminal groove 311 by means of the first tab 331 to be thereby secured.

Figure 7:
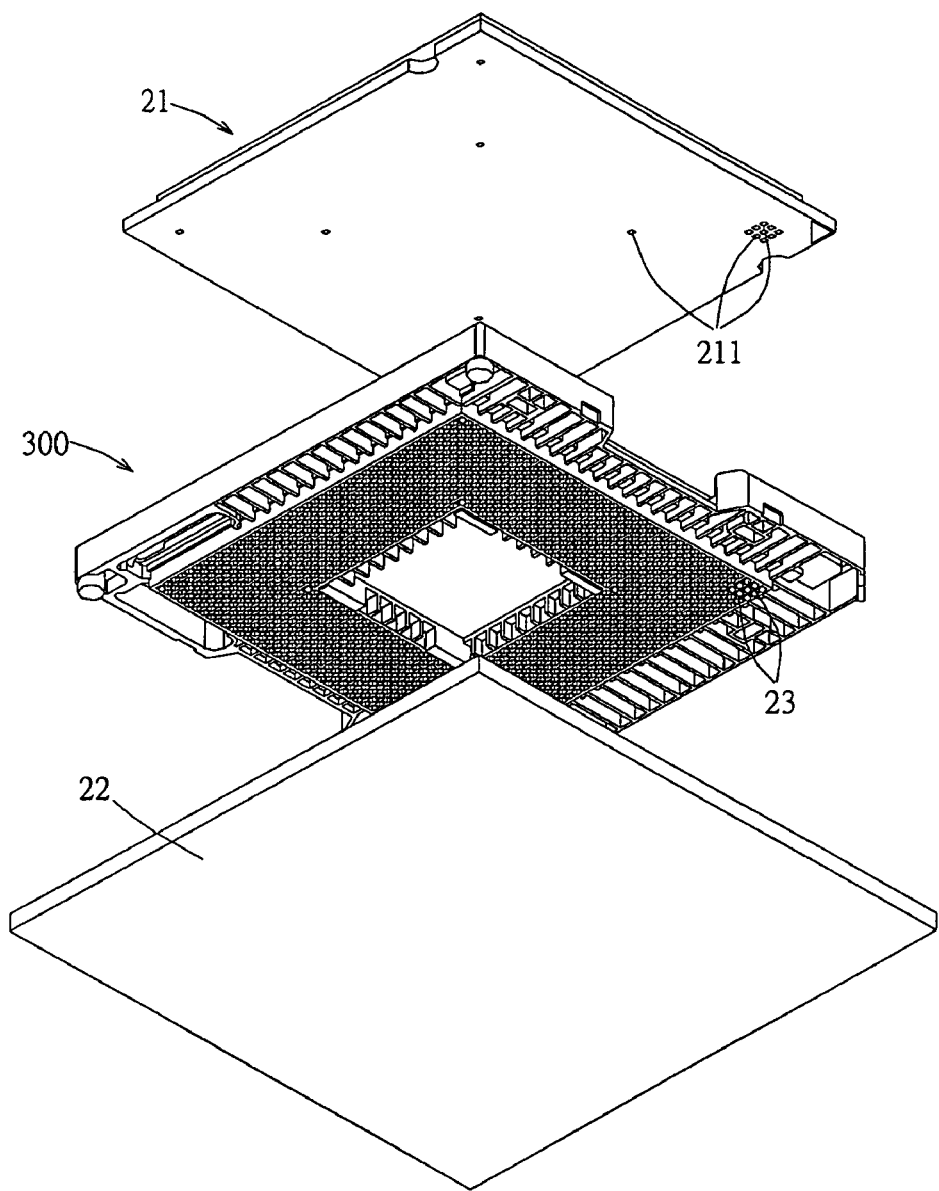
FIG. 7 is an exploded perspective view to illustrate the positional relationship between the first preferred embodiment and a central processing unit and a circuit board from another angle, with some terminals, solder balls, and contacts omitted from the figure.

In this embodiment, since the soldering portion 323 of the terminal 32 is soldered to a circuit board contact 221 of the circuit board 22 by means of a solder ball 23 (see FIG. 7), the soldering portion 323 of each terminal 32 includes a transverse plate body 329 for electrical connection of the solder ball 23 to a bottom side of the transverse plate body 329. However, the electrical connection between the terminal 32 and the circuit board 22 is not limited to the aforesaid method. The soldering portion 323 of the terminal 32 can be modified to be a pin extending through a through hole in the circuit board for electrical connection, or can be electrically connected to the circuit board 22 by press-contact. Since this is well known to those skilled in the art, a detailed description thereof is omitted herein for the sake of brevity.

When the central processing unit 21 is retained on the top face of the insulating housing 31 of the electrical connector 300, the contacts 211 (see FIG. 7) disposed on the bottom face of the central processing unit 21 will respectively press-contact the contact portions 325 of the corresponding terminals 32 so as to establish an electrical connection with the circuit board 22. At this time, the resilient contact arm 324 of the terminal 32 will bend under the force.

Therefore, since the first tab 331 is located between the first and second support arms 326, 327, compared to the prior art in which the tabs are provided only below the resilient arm, the distance between the first tab 331 and the contact portion 325 in this embodiment can be smaller than the distance between the tabs and the contact portion in the prior art. Thus, when the central processing unit 21 press-contacts the contact portion 325 of the terminal 32, the terminal 32 will experience a smaller torque and can be firmly disposed in the terminal groove 311.

Figure 8:
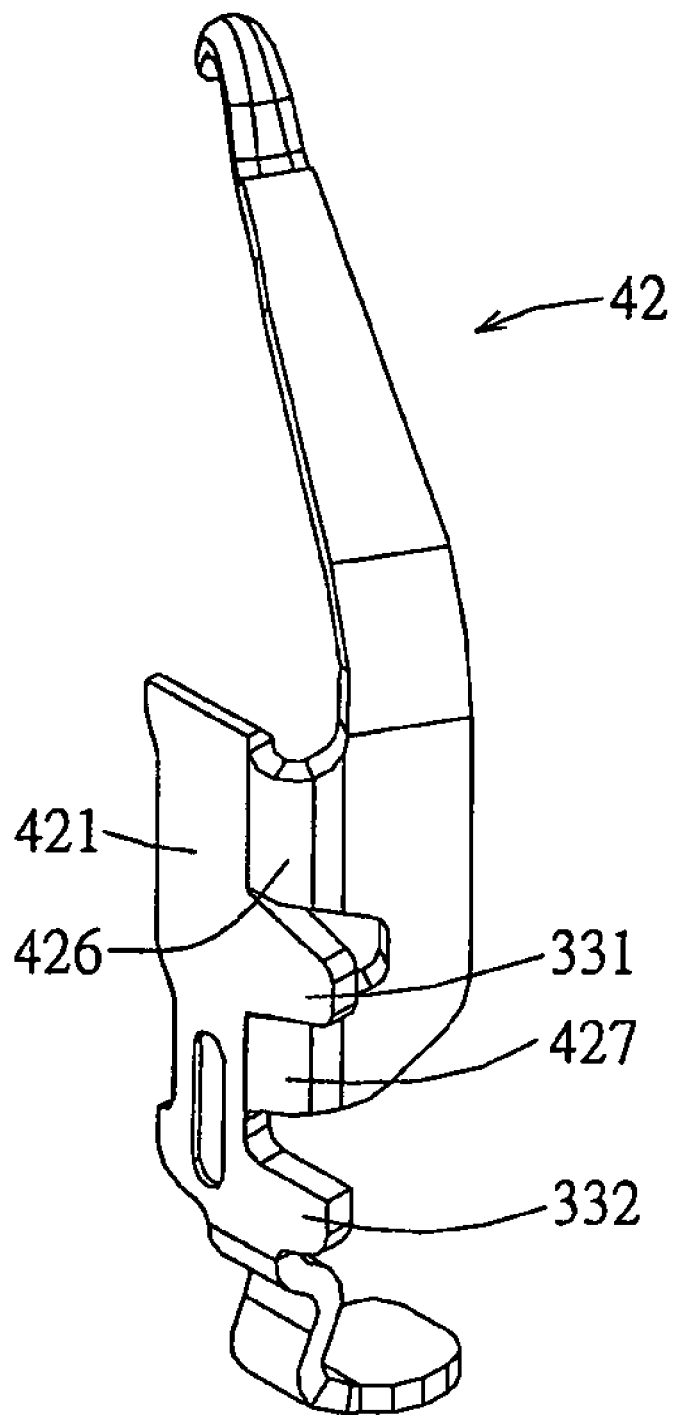
FIG. 8 is a perspective view to illustrate the second preferred embodiment of an electrical connector and a terminal thereof according to the invention.

Referring to FIG. 8, the second preferred embodiment of the electrical connector of this invention differs from the first preferred embodiment in that each terminal 42 further has a second tab 332 extending from the lateral edge of the first body 421 below the first and second support arms 426, 427, and the second tab 332 is retained on the wall surface forming the corresponding terminal groove. Therefore, the terminal 42 of this embodiment can be more firmly disposed in the terminal groove. Moreover, compared with the prior art in which tabs are respectively provided above and below the juncture between the resilient arm and the body, the distance between the first and second tabs 331, 332 can be smaller than the distance between the two tabs of the prior art. Thus, the height of the terminal groove can be reduced, i.e., the insulating housing can have a reduced height and can be designed to be low-profile.

Figure 9:
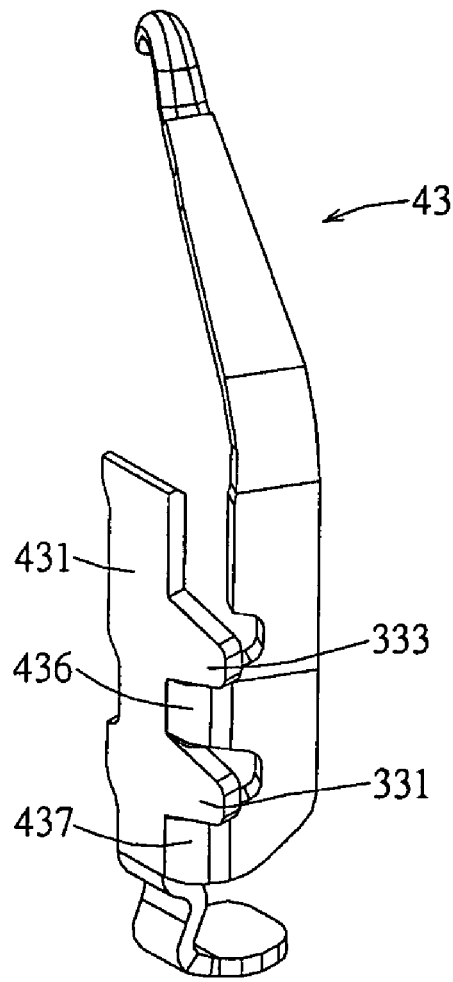
FIG. 9 is a perspective view to illustrate the third preferred embodiment of an electrical connector and a terminal thereof according to the invention.

Referring to FIG. 9, the third preferred embodiment of the electrical connector of this invention differs from the first preferred embodiment in that each terminal 43 further has a second tab 333 extending from the lateral edge of the first body 431 above the first and second support arms 436, 437, and the second tab 333 is retained on the wall surface forming the corresponding terminal groove. Therefore, the terminal 43 of this embodiment can likewise be more firmly disposed in the terminal groove. Moreover, since the distance between the first and third tabs 331, 333 is short, the height of the insulating housing can likewise be reduced.

Figure 10:
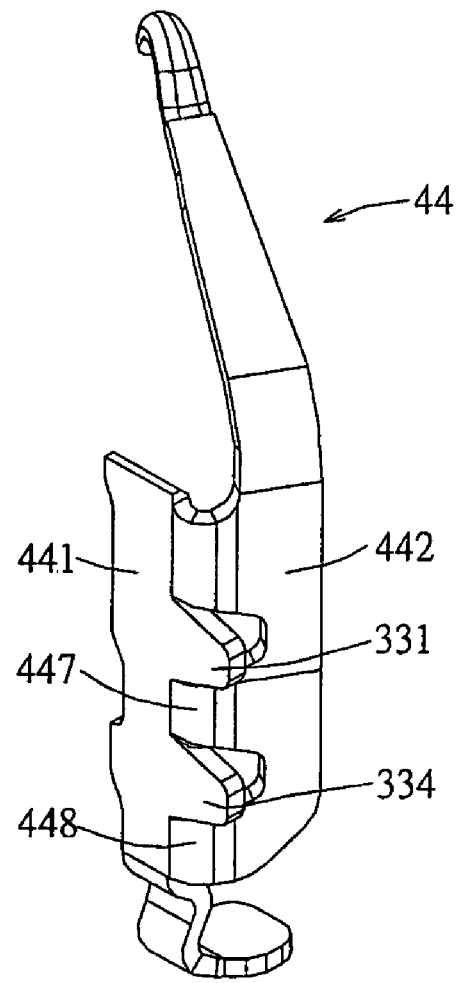
FIG. 10 is a perspective view to illustrate the fourth preferred embodiment of an electrical connector and a terminal thereof according to the invention.

Referring to FIG. 10, the fourth preferred embodiment of the electrical connector of this invention differs from the first preferred embodiment in that each terminal 44 further includes a third support arm 448 bending and extending from the lateral edge of the first body 441 to the adjacent lateral edge of the second body 442, the third support arm 448 being adjacent to the second support arm 447, and a second tab 334 extends from the lateral edge of the first body 441 between the second and third support arms 447, 448, the second tab 334 being likewise retained on the wall surface forming the corresponding terminal groove. Therefore, the terminal 44 of this embodiment can likewise be more firmly disposed in the terminal groove. Moreover, since the distance between the first and second tabs 331, 334 is short, the height of the insulating housing can likewise be reduced.

In sum, in the electrical connector 300 and the terminal 32, 42, 43, 44 thereof in this invention, since the first tab 331 extending from the lateral edge of the first body 321, 421, 431, 441 is located between the first support arm 326, 426, 436 and the second support arm 327, 427, 437, 447, when the central processing unit 21 press-contacts the contact portion 325 of the terminal 32, 42, 43, 44, the arm of force in this invention can be considered to be shorter than the arm of force in the prior art, so that the torque experienced by the terminal 32, 42, 43, 44 is smaller. Therefore, the terminal 32, 42, 43, 44 can be more firmly disposed in the terminal groove 311. If the second tabs 332, 333 or 334 is additionally provided for enhanced stability, since, compared with the prior art in which tabs are respectively disposed above and below the juncture between the resilient arm and the body, the distance between the first and second tabs can be smaller than the distance between the two tabs of the prior art, the height of the insulating housing 31 can be reduced. Thus, the objects of this invention can be achieved.

However, the foregoing is merely a description of the disclosed embodiments of this invention, and shall not be based upon to limit the scope of this invention in practice. That is, any simple equivalent changes and modifications made within the scope of the claims of this invention and the specification of this invention shall be deemed to fall within the scope of a patent issued on this invention.

While a preferred embodiment of the invention is shown and described, it is envisioned that those skilled in the art may devise various modifications without departing from the spirit and scope of the foregoing description and the appended claims.

What is claimed is:

1. A terminal comprising a first body and a second body having lateral edges adjacent to each other, the first body extending downward to form a soldering portion, the second body bending and extending upward to form a resilient contact arm, wherein the first and second body are coupled together via a first support arm and a second support arm that bend and extend from a lateral edge of the first body to an adjacent lateral edge of the second body, and a first tab extending from the lateral edge of the first body between the first and second support arms.

2. The terminal according to claim 1, wherein the lateral edge of the first body includes a second tab extending between the support arms and the soldering portion.

3. The terminal according to claim 1, wherein the lateral edge of the body includes a second tab extending between the support arms and the contact arm.

4. The terminal according to claim 1, further comprising a third support arm coupling the first and second body together, the third support arm bending and extending from the lateral edge of the first body to the adjacent lateral edge of the second body, the third support arm being disposed adjacent to the second support arm, and a second tab extending from the lateral edge of the first body between the second and third support arms.

5. The terminal according to claim 1, wherein a distal end of the resilient contact arm is formed with a contact portion.

6. The terminal according to claim 1, wherein the soldering portion includes a transverse plate body.

7. An electrical connector comprising:
   an insulating housing including a plurality of terminal grooves, the terminal grooves including a wall surface; and
   a plurality of terminals disposed respectively in the terminal grooves, each terminal including a first body and a second body having lateral edges adjacent to each other, the first body extending downward to form a soldering portion, the second body bending and extending upward to form a resilient contact arm, wherein the terminal further includes a first support arm and a second support arm coupling the first and second body together and bending and extending from a lateral edge of the first body to an adjacent lateral edge of the second body, and a first tab extending from the lateral edge of the first body between the first and second support arms, the first tab of each terminal being retained on the wall surface of the corresponding terminal groove.

8. The electrical connector according to claim 7, wherein each terminal further has a second tab extending from the lateral edge of the first body between the support arms and the soldering portion, the second tab being retained on the wall surface of the conesponding terminal groove.

9. The electrical connector according to claim 7, wherein each terminal further has a second tab extending from the lateral edge of the first body between the support arms and the contact arm, the second tab being retained on the wall surface forming the conesponding terminal groove.

10. The electrical connector according to claim 7, wherein each terminal further includes a third support arm coupling the first and second body together and bending and extending from the lateral edge of the first body to the adjacent lateral edge of the second body, the third support arm being disposed adjacent to the second support arm, a second tab extending from the lateral edge of the first body between the second and third support arms, the second tab being retained on the wall surface forming the corresponding terminal groove.

11. The electrical connector according to claim 7, wherein a distal end of the resilient contact arm of each terminal is formed with a contact portion.

12. The electrical connector according to claim 7, wherein the soldering portion of each terminal is formed with a transverse plate body.

* * * * *